United States Patent
Yates et al.

[11] Patent Number: 5,989,727
[45] Date of Patent: Nov. 23, 1999

[54] ELECTROLYTIC COPPER FOIL HAVING A MODIFIED SHINY SIDE

[75] Inventors: Charles B. Yates, Princeton; Adam Wolski, Edgewater; George Gaskill, Manahawkin, all of N.J.; Chinsai T. Cheng, Orange, Conn.; Keith Bodendorf, Westhampton, N.J.; Paul Dufresne, Langhorne, Pa.

[73] Assignee: Circuit Foil U.S.A., Inc., Bordentown, N.J.

[21] Appl. No.: 09/034,264

[22] Filed: Mar. 4, 1998

[51] Int. Cl.$^6$ .......................... B32B 15/08; B32B 15/20; C25D 7/06
[52] U.S. Cl. .................. 428/607; 428/612; 428/626; 428/675; 428/687; 205/111; 205/182
[58] Field of Search ...................... 428/607, 612, 428/626, 675, 687, 209, 935; 174/256, 259; 205/111, 182, 223

[56] References Cited

U.S. PATENT DOCUMENTS

| | | | |
|---|---|---|---|
| Re. 30,180 | 12/1979 | Wolski et al. | 428/601 |
| 3,625,844 | 12/1971 | McKean | 205/142 |
| 3,853,716 | 12/1974 | Yates et al. | 204/28 |
| 3,857,681 | 12/1974 | Yates et al. | 29/195 |
| 4,572,768 | 2/1986 | Wolski et al. | 204/15 |
| 4,961,828 | 10/1990 | Lin et al. | 205/111 |
| 4,997,516 | 3/1991 | Adler | 156/630 |
| 5,207,889 | 5/1993 | Wolski et al. | 205/155 |
| 5,403,465 | 4/1995 | Apperson et al. | 205/77 |
| 5,437,914 | 8/1995 | Saida et al. | 428/209 |
| 5,447,619 | 9/1995 | Wolski et al. | 428/607 |
| 5,456,817 | 10/1995 | Hino et al. | 205/125 |
| 5,545,466 | 8/1996 | Saida et al. | 428/209 |
| 5,779,870 | 7/1998 | Seip | 205/111 |
| 5,834,140 | 11/1998 | Wolski et al. | 428/607 |

FOREIGN PATENT DOCUMENTS 5-29740  2/1993  Japan.

*Primary Examiner*—John J. Zimmerman
*Attorney, Agent, or Firm*—Finnegan, Henderson, Farabow, Garrett & Dunner, L.L.P.

[57] ABSTRACT

Treated electrolytic copper foil wherein the shiny side of the raw foil is modified and smoothed by an electrodeposited copper gilding layer, a copper-clad laminate produced with such foil, and an electrical circuit produced from such a laminate. The preferred foil has the surface of the shiny side of the raw foil modified by an electrodeposited copper gilding layer, a copper dendritic layer electrodeposited on the gilding layer, and a second copper gilding layer electrodeposited on the first dendritic layer, while a copper dendritic layer is electrodeposited on the surface of the matte side of the foil, and a copper gilding is electrodeposited on the latter dendritic layer.

14 Claims, 4 Drawing Sheets

|  | PRIOR ART (RTF) | INVENTION (MSS) |
|---|---|---|
| PEAK - PEAK DISTANCE ($\mu$) | 8 - 10 | 1 - 2 |
| PEAK HEIGHT ($\mu$) | 8 - 9 | 3 - 4 |
| PEAK COUNTS/ IN$^2$ | $6.5 \times 10^6$ | $4 \times 10^8$ (60 X) |
| SURFACE ROUGHNESS - Rz ($\mu"$) | 175 | 137 |
| CRYSTAL SHAPE | LARGE PYRAMIDS | SMALL BALLS |
| SURFACE PROFILE | PEAKS & VALLEYS | FLAT |

*FIG. 3*

ELECTROLYTIC COPPER FOIL HAVING A MODIFIED SHINY SIDE

BACKGROUND OF THE INVENTION

1. Field of the Invention

This invention relates to electrolytic copper foil, more particularly, to such copper foil produced on a rotating drum cathode machine and having its shiny side (drum side) modified by a copper gilding layer electrodeposited thereon, and still more particularly, to such copper foil wherein a copper bonding treatment is formed both on the matte side and the modified shiny side of the foil.

2. Background of the Invention

Electrolytic copper foil produced on rotating drum machines, prior to being treated, is usually referred to as raw foil. The raw foil is pink in color and has two distinctly looking sides—a "shiny side", the side which was plated onto the drum surface and then stripped is smooth, while the other side, the side which was facing the electrolyte and the anodes, is referred to as the "matte" side since it has a velvety finish, due to the difference in the growth rate of differing crystal faces during electrodeposition of the raw foil. The matte side surface, at this stage has a very fine scale micro-roughness and a very specific micro-topography. Viewed under high magnification of a scanning electron microscope, it is composed of peaks and valleys. The peaks are closely packed cones or pyramids. The cone's height, slant, packing and shape depend, as is well known, upon closely controlled independent variables of foil thickness, current density, solution composition and temperature and the type and concentration of the addition agents and the like.

In the fabrication of copper-clad laminates for printed circuit boards (PCBs), copper foil is bonded to polymeric substrates (composite materials: epoxy, polyamide and other similar resins reinforced with glass fiber fabric) by means of mechanical interlocking at the interface between the two materials. To achieve a high degree of interlocking, the bonding side of the foil is provided with a "bonding treatment".

Various patents directed to bonding treatments for copper foil disclose, for example, that one or both sides of the foil which is to be bonded to the substrate is subjected to the bonding treatment (U.S. Pat. No. 5,207,889), or that such treatment for copper foil to be used for lamination to a substrate comprises electrodepositing a dendritic layer of copper followed by a gilding, or encapsulating, layer of copper on the side of the foil that is to be laminated to the board (U.S. Pat. Nos. 3,857,681, Re. 30,180 and 4,572,768).

Such bonding treatment is an extremely dense coating of spherical micro-projections, which is usually electrodeposited to the matte side of base copper foil. This matte side, in itself, is composed of densely packed, micro-conical or micro-pyramidal shapes, which form a micro-topography of peaks and valleys. The peel strength of cooper foil (force necessary at separate, or pull away, the foil from polymer substrate) will depend on the shape of individual micro-projections, their mechanical strength and hardness, density per surface area, and their distribution over micro-peaks and micro-valleys of the matte side of the base foil. In turn, all the factors listed above will depend on the conditions under which the treatment is electrodeposited and the micro-topography of the base foil. Usually, processes for the electrodeposition of bonding treatments employ plating conditions which give rise to high cathodic concentration polarization, namely high current density, low copper concentration and temperature of the electrolyte. Often, the addition of other ionic species, such as chlorides or arsenic, are used to enhance tree-like (on a microscopic scale) structures, which are good for bonding. As such deposits are, by nature, good for increasing surface area, but weak mechanically, the second step of the treatment, locking or encapsulation, usually follows the first step, in order to improve the treatment's mechanical resilience. The treatment operation is conducted in the machines called treaters. Rolls of raw foil are placed at an unwinding station of the treater and fed into the treater by means of driven rollers (similar to the way in which a web of paper is handled in a printing machine), rendered cathodic by means of contact rollers, and passed in a serpentine fashion through a series of plating tanks, facing a rectangular anode in each tank. Each tank has its own supply of appropriate electrolyte and its d.c. power source; between the tanks, the foil is thoroughly rinsed on both sides. The purpose of this operation is to electrodeposit micro-projections of complex shape (visible only under high magnification microscope) on the matte side of the foil, which ensure that the foil may be firmly anchored to the base polymeric materials used in PCB's fabrication. The last tank of the treater provides the foil with a so-called stainproof layer, which prevents staining, tarnishing and oxidation and imparts long shelf life on the foil. Upon leaving the passivation tank, the foil is subjected to the final rinse, dried and coiled into rolls by take-up driven shaft-rollers. At that stage, foil is a finished product. Obviously, to be capable of handling a very thin and fragile copper foil in a manner described above, treater machines are custom built and very carefully engineered. A system of driving the rollers and the foil, web guiding, tension control devices, synchronization at peripheral speed of all guiding rollers, precise machining of "contact rollers" which pass electric current into the foil etc., are the elements of treaters design and engineering which together combine to make treaters very sophisticated and expensive machines.

The basic raw material for manufacture of printed circuits is a laminate clad with copper foil. It is comprised of a thin copper foil firmly bonded to a polymeric, dielectric (insulating) base material. This "bonding" operation is conducted in laminating plants and involves heating and cooling cycles. Sheets of copper foil are laid upon sheets of "prepreg" (e.g. glass fabric impregnated with epoxy resin). Both materials are placed in a hydraulic press having heated pressing plates, while-the two materials are pressed-together under high pressure. At elevated temperatures, the resin liquefies and is forced, by the pressure, to flow into the micro-irregularities of the foil surface. This is followed with a second cycle, when both materials are cooled while the pressure is being maintained. The resin solidifies in the irregularities of the foil surface and both materials are firmly bonded together and are very difficult to pull apart. The "peel strength" between both materials is high, because the bonding side of the copper foil is provided with the bonding treatment. High peel strength is a characteristic of the highest importance since the mechanical support of the circuit elements as well as the current carrying capability of PCB's is provided by the copper foil polymer joint. It is essential that the foil is bonded very tightly and securely to the laminate and also that such an adhesive joint can withstand all the manufacturing steps in PCB's fabrication without a decrease of the initial adhesion, which, moreover should remain constant throughout the service life of the PCB. It is a well-established fact that to achieve satisfactory adhesion in bonding operations, metallic substrates have to be pretreated. A satisfactory pretreatment must not only give the appropriate initial level of adhesion but must also provide "durability". The adhesion must not be seriously affected by environmental conditions, specifically, processing chemicals used in PCB's fabrication, elevated temperatures, high humidity or water. Obviously, copper foil-polymeric substrate bond strength is more and more important as fine-line applications become more common. The adherence between copper foil and the substrate must not only be adequate initially, but ought to be durable and permanent. The usual testing of the peel strength of the sheared 1 cm (or 1 inch) wide specimen of the clad laminate offers only a broad idea of the reliability of the joint to the circuit designer. The permanency of the peel strength under various environmental conditions encountered in PCB's fabrication and their service life is probably no less important. Electrodeposited bonding treatment and its role represent a very special case of industrial application of the electrodeposit. In electrodeposition in general, the adherent, compact deposits are of practical use and the loose, powdery or dendritic deposits are regarded as a nuisance. Powdery electrodeposits, however, have their own technical applications, particularly in the field of powdered metallurgy or catalysis. We have found such deposits to be convenient for providing copper foil with good bonding characteristics.

The parameters of the dendritic (treatment's first step) deposition are purposefully set as to encourage the growth of powdery/dendritic layers. They are:

Low copper concentration

Low temperature

High current density

All these factors lead to high cathodic polarization, or poor mass transport, which enhances the dendritic (tree-like) character of the deposit. What makes the treating process even more complex, is the fact that it is electrodeposited on the matte side of the base foil surface which is not truly flat, but composed of microscopic peaks and valleys. In general, the structure of a deposit depends strongly on the rate of formation of new nuclei and the rate of growth of the already existing crystals. The grain size is especially affected by the ratio of these two rates. If the rate of nucleation is small and the rate of crystal growth large, a deposit with coarse grains results. In the contrary case, the deposit is fine grained. Powder formation can then be regarded as a limiting case in which the rate of nucleation is large and the growth of crystals, particularly their intergrowth, is strongly inhibited. One could add that between the extreme cases of highly dispersed powder and an even, well-adhering deposit, many intermediate cases may occur. Only a narrow range of copper particle size and shape combination is well suited to be the foil bonding. We have mentioned before that powder formation is brought about when the rate of nucleation is large while the growth of crystals is inhibited. These conditions are the consequence of the depletion of copper ions near the cathode (matte side of the foil). It is well established that the depletion of the metallic ions near the cathode is a decisive factor in powder formation. More precisely, powder formation starts when the limiting current is reached or approached, e.g., when the concentration of metallic ions at the cathode-solution interface is zero. The limiting current and, more specifically, the depletion near the cathode, are governed by mass transfer processes.

Bonding treatment may be effected by subjecting the matte side of the "raw" foil to four consecutive electrodeposition steps. The first consists of the deposition of the microdendritic layer which enhances, to a very large degree, the real surface area of the matte side, and thus enhances the foil's bonding ability. This is followed by electrodeposition of an encapsulating (gilding) layer, whose function is to reinforce mechanically the dendritic layer and thus render it immune to the lateral shear forces of liquid resins in the laminating stage of PCB's fabrication. The encapsulating step of the treatment is very important, since it eliminates the foil's tendency toward "treatment transfer" and the resulting "laminate staining" which can cause a decrease of the laminate's dielectric properties. Such a dendrites-encapsulation composite structure should be characterized by high bond strength and the absence of treatment transfer. The treating parameters which assure just that are relatively narrow. If the amount of gilding deposit is too low, the foil will be given to treatment transfer, if on the other hand gilding layer is too thick, a partial loss of peel strength may be expected. These first two steps of the treatment are composed of pure copper, in the form of microscopic, spherical micro-projections. The electrodeposition of this copper bonding treatment is followed by deposition of a very thin layer of zinc or zinc alloy, a so-called barrier layer. Its purpose is to prevent direct copper-epoxy resin contact, and that is why the zinc-alloy layer (which during lamination is converted to alpha brass) is called the barrier layer. If the bonding treatment composed of copper only is subjected to lamination with epoxy resin systems, it tends to react with amino groups of the resin at the high laminating temperatures. It, in turn, creates moisture at the foil-resin interface, causing a harmful effect of "measling" and possibly delamination. A barrier layer which is plated over all-copper treatment prevents these harmful effects entirely. All three stages of the treatment mentioned above, effected by means of electrodeposition, change the geometry and morphology of the matte side of the foil, assuring the mechanical strength of the surface region, as well.

The electrodeposition of the treatment is typically followed by an electrochemical stainproofing which changes the surface chemistry. As a result of this step, the bonding surface is rendered chemically stable. This operation removes weak surface films, which can greatly decrease the adhesion of the solids, and replace them with a stable film of controlled thickness, responsible for imparting "durability" of its properties on the treated surface. The film serves as an undercoat for subsequent bonding. The same stainproofing step protects the shiny side of the foil against atmospheric oxidation.

Contemporary bonding treatments were invented in the early seventies and the major foil manufacturers are using the same techniques today. The changes that have occurred in the intervening years pertain, by and large, to the composition of the barrier layers, and have been made to accommodate technical needs imposed by the emergence of new polymeric dielectric substrates used in the manufacture of PCB's. For example, polyimide substrates introduced to the printed circuit industry fairly recently require a much higher laminating temperature than the epoxy pre-pregs. Consequently, foil manufacturers modified this portion of the overall treating processes in order to achieve the desired composition and performance of barrier layers for the foils that are destined for polyimide applications. Barrier layers on polyimide-grade treatments have to withstand much higher laminating and post-bake temperatures, compared to the treatments destined for epoxy applications. High temperature at the metal-polymer interface can subject the metal surface to oxidation with the attendant partial loss of adhesion. A well designed barrier layer will be self-protected along with the underlaying all-copper treatment from heat oxidation and the loss of bond. Other changes in the technology of the bonding treatment are occurring as well. For example, some major foil manufacturers build their new treaters with a larger number of individual plating tanks, in order to apply twice the sequence of dendritic deposit followed by encapsulating deposit. Thus, quite often, the first four tanks of the treater are devoted to the application of micro-roughening treatment that consists of a dendritic layer followed by an encapsulation layer, and this composite plural layer is repeated twice. This practice is aimed at being able to run the treater at greater speeds, since the initial capital outlay for the construction of the treaters is very high today. Conversely, the larger the number of tanks, with the treater run at more traditional speeds, permits deposition of a greater mass or weight of the treatment to assure acceptable peel-strength on so-called "difficult to bond to" polymeric substrates that aim at higher glass transition temperatures. These substrates, which are often a blend that involves multifunctional epoxies, BT resin, polyimide etc. usually require an increased amount of bonding treatment to assure adequate peel-strength. It should be remembered that aside from its bond-enhancing microstructure, the amount of treatment per surface area of copper foil is also an important factor.

With the advent of miniaturization, very densely packed printed circuit boards are needed. Miniaturization often requires that the copper foil conductor, or track lines, of today's printed circuit board be as narrow as 5 mils, or less. The degree of high definition of fine line circuitry depends on the quality of copper foil manufactured for the electronic industry, particularly on surface quality of both sides of the foil. One side of the foil, whose role is to firmly anchor track lines to the polymeric substrate, is provided with a bonding treatment. After the foil is bonded to the substrate the other side of the foil, which forms the outer surface of copper-clad laminate, is used for image patterning.

It is the practice in manufacturing printed circuit boards from copper-clad laminates to form an image of the desired printed circuit pattern on the exposed copper surface of a laminate by a photographic technique which leaves the desired pattern formed of a photo-resist material on the surface of the copper.

It will be appreciated that for the photographic imaging to be sharp and precise, the photo-resist has to spread well on the foil's surface and adhere well to this surface.

It is a practice in manufacturing PCBs to roughen the exposed surface of the copper to achieve good resist adhesion. This roughening also removes tenacious stainproof films which foil manufacturers apply to the foil to protect it from oxidation and staining before it reaches the user. Photo-resist does not adhere to the stainproof films, which therefore have to be removed. Thus, roughening of the foil surface serves the purpose of removal of stainproof film, as well as changing the copper surface topography from smooth to micro-rough, to facilitate photo-resist adhesion which is a condition of good definition of track lines.

This roughening is performed by either mechanical means, e.g., abrasion by brushes, scrubbing with pumice, or chemical means (so-called micro-etching), which is accomplished by subjecting the copper surface of copper-clad laminates to the etching action of oxidizing mineral acids. Such acids attack the smooth surface of the foil along the copper grain boundaries, thus creating pits and pores and changing the copper surface from smooth to micro-rough.

Multi-layer printed circuit boards, so-called MLBs, now dominate the printed circuit board market, since they permit achieving the highest functional density in electronic packaging. In the fabrication of MLBs, copper foil is laminated (bonded) to polymeric substrates twice. First, thin, double-sided copper clad laminates are produced. These laminates are then subjected to image patterning and etching away of unwanted copper to produce the desired patterns of circuitry. Several layers of double-sided boards prepared in such a manner are stacked together, with sheets of prepreg (glass reinforced polymeric resin composites) inserted in between to dielectrically separate adjacent boards from one another. Such a stack of circuit boards and pre-preg is then laminated together, in the so-called "B-stage lamination", to form a monolithic multi-layer board. Later, holes are punched or drilled through the board in pre-arranged places and so-called thru-hole plating of copper is used to ensure the electrical interconnection between all layers of copper-track conductor lines.

It is a practice in the fabrication of MLBs to subject the inner layer boards, with their patterns of circuitry, to a so-called brown-oxide treatment, which changes the micro-topography of the top surfaces of the track lines to improve their bondability to the polymeric pre-preg. This brown oxide treatment is typically produced by immersing the boards in an alkaline solution of sodium chlorite, which by its oxidizing action causes the conversion of metallic copper on top surfaces of exposed copper tracks into cupric oxide CuO with a possible admixture of cuprous oxide $Cu_2O$, depending on the type of the bath and operation conditions.

This oxide coating grows in the form of dendritic crystals, perpendicular to the surface of the copper tracks. Thus, the surface area available for bonding to polymeric substrates is increased and improved "bondability" is achieved.

We have found that adhesion between the copper surface and the photo-resist is a crucially important component in the subsequent processing of boards having fine line circuitry, because the edge of the photo resist defines the area of copper whereon all subsequent processing will be carried out. This processing can be either the removal of copper by etching or the addition of copper required in so-called through hole plating. If adhesion between the resist and the copper is inadequate then the boundary between the original copper and the etched or plated copper will become irregular so that there is the possibility that variations in the cross sectional area of the circuit path could occur. It therefore becomes clear that any adhesion-promoting roughening of the shiny side of the copper must be carried out by techniques that are controllable within close parameters for optimum utility. This is particularly important as line widths of the circuitry decrease.

Accordingly, we have conducted considerable experimentation with ways of improving such adhesion. As a result of this work, we have developed a novel electrolytic copper foil having its shiny side modified by a micro-roughening deposit which comprises an electrodeposited copper gilding layer, which deposit enables superior wetting by and adhesion to photoresist materials and is unusually well-suited for use in producing copper-clad laminates to be used in the manufacture of circuit boards having fine line circuitry. This modified shiny side foil is sometimes hereinafter referred to as "MSS foil".

An object of the present invention is an electrolytic copper MSS foil having a modified shiny side providing superior adhesion to photoresist materials. Another object of the invention is a copper-clad laminate wherein the matte side of such MSS foil is laminated to a polymeric substrate through a copper bonding treatment electrodeposited on the matte side of the foil. A further object of the invention is an electrical circuit formed on the copper-clad laminate by applying a photoresist material on the modified shiny side of the foil, image patterning and etching to form the circuit.

SUMMARY OF THE INVENTION

The above and other objects of the invention are enabled by a treatment copper foil comprising electrolytic copper foil having a matte side and an opposite shiny side, wherein an electrodeposited copper gilding layer is applied directly on the surface of the shiny side of the foil and a micro-roughening layer is electrodeposited on the gilding layer.

In accordance with a preferred embodiment of the present invention there is provided a treated copper foil comprising:

(a) an electrolytic copper base foil having a matte side and an opposite shiny side;

(b) a first copper bonding treatment on the matte side formed of (i) a first electrodeposited dendritic copper layer on the surface of the matte side, and (ii) a first electrodeposited copper gilding layer on the dendritic layer, forming a treated matte side; and (c) a micro-roughening copper layer on the shiny side formed of (i) a second electrodeposited copper gilding layer on the surface of the shiny side, (ii) a second electrodeposited dendritic copper layer on the second gilding layer, and (iii) a third electrodeposited gilding layer on the second dendritic layer, forming a treated shiny side.

The present invention also provides a copper-clad laminate comprising the above treated foil and a polymeric substrate wherein the treated matte side is bonded to the substrate, as well as a printed circuit produced from such a laminate.

BRIEF DESCRIPTION OF THE DRAWINGS

The present invention will now be described in connection with the attached drawings, wherein:

FIG. 3 illustrates a comparison of foil in accordance with the present invention versus regular treated foil;

DESCRIPTION OF PREFERRED EMBODIMENTS

The copper micro-roughening layer may be electrodeposited on the gilding layer on the shiny side of the foil using any method which provides a satisfactory fine and uniform micro-rough outer surface. The copper bonding treatment may be electrodeposited on the matte side of the foil by any method providing a satisfactory peel strength and durability when bonded to a polymeric substrate. However, it is highly preferred that the micro-roughening layer and the bonding treatment be formed as described hereinbelow.

As used herein, the term "gilding," or "encapsulation," layer refers to a gilding or encapsulation copper layer which is not nodular in structure, but which conforms to the configuration of the surface on which it is deposited. When applied on a dendritic layer such gilding layer does not reduce the bond strength applied by the dendritic layer, but ordinarily will increase the bond strength and will eliminate the powder transfer characteristics thereof. When applied directly on the surface of the shiny side of the foil it fills in surface irregularities therein and provides a leveling effect, in that the surface thereof is smoother than the shiny side surface of the raw foil. In applying the gilding layer, typically, about 3–7 grams of copper is deposited per square meter of surface of the raw foil.

As used herein, the term "dendritic" layer refers to a nodular, powdery electrodeposited copper layer which is coarse and rough and weakly adherent to the base foil. The amount of copper deposited in forming the dendritic layer is typically about 3–5 grams per square meter of foil.

Figure 1:
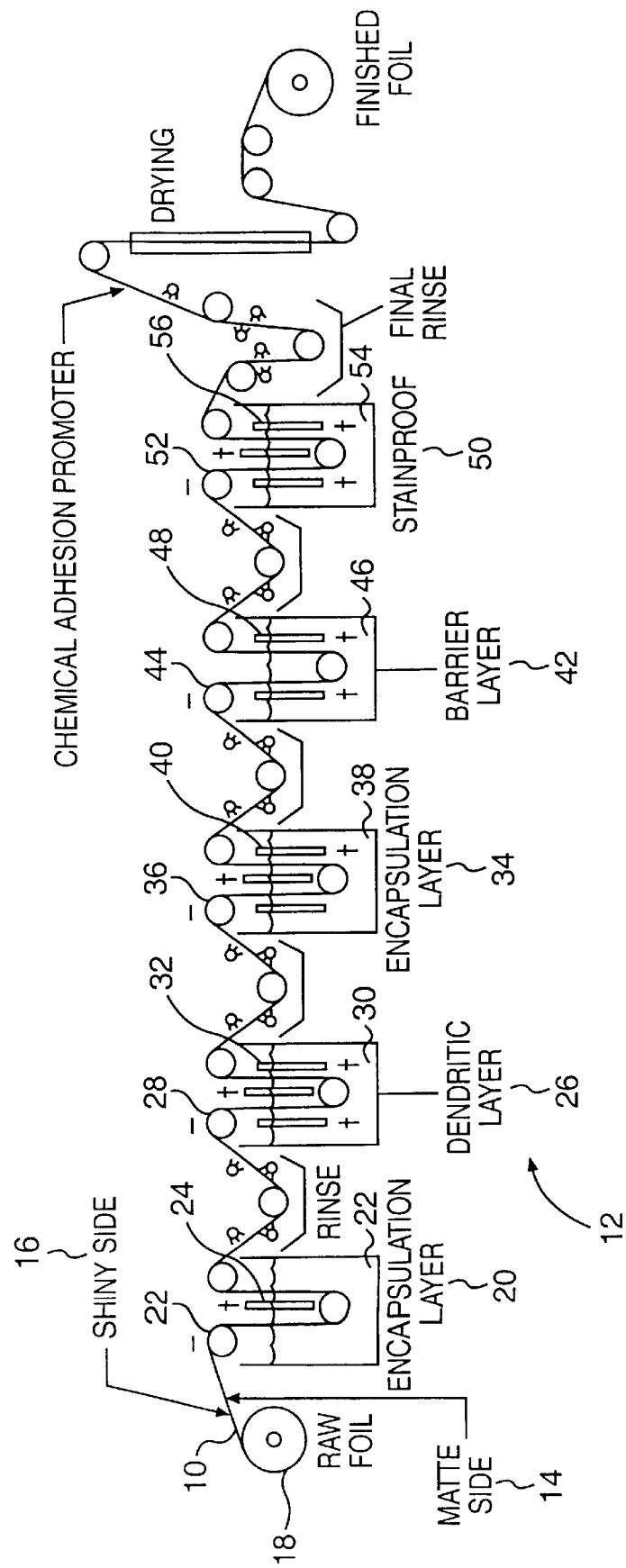
FIG. 1 schematically illustrates apparatus for producing copper foil in accordance with the present invention.

Referring to FIG. 1, MSS foil is produced by passing raw foil 10 through a treater machine 12, with the purpose of electrodepositing "normal" bonding treatment on the matte side 14 of the foil and also electrodepositing a micro-rough layer onto the shiny side 16 of the foil.

To achieve that, the treater, comprised of a plurality of stations, is equipped with anodes that face the matte side of the foil and/or shiny side of the foil. These anodes are connected to the positive terminals of separate (different) D.C. rectifiers (not shown), therefore current densities, amount of current, and therefore the weight per surface area and the shape of electrodeposits plated onto the matte side and onto the shiny side are independently controlled. Electric current is passed from the anodes through an electrolyte in each station to the foil 10, which rendered cathodic by contact with contact rollers.

The raw electrolytic foil 10 is produced in a rotating drum cathode made by a process which is well-known and need not be described herein. The raw foil has a matte side 14 and an opposite shiny side 16. Typically, the raw foil is wound on a drum 18 and transferred to a treater where it is then unwound and passed to a first encapsulation, or gilding, layer station 20 where it passes over contact roller 22, and is immersed in a first electrolyte 22 in the tank of the encapsulation station, where the shiny side passes in front of an anode 24, and an electric current is passed from anode 24 through electrolyte 22 to the foil 10, which serves as a cathode. In encapsulation station 20, the electroplating conditions, i.e., the composition of electrolyte 22, the current density, the plating time, etc., are selected to electrodeposit directly on the shiny side 16 an encapsulating, or gilding layer, of copper. The characteristics of this gilding layer and electrodeposition conditions useful in the first encapsulation station are well-known and are disclosed, for example, in U.S. Pat. Nos. 3,857,681, 4,572,768 and Re. 30,180, all of which are incorporated herein by reference.

After the foil emerges from encapsulation station 20, it is rinsed and passed to dendritic layer station 26 where it passes over contact roller 28, is immersed in electrolyte 30 and each of the partially treated shiny side and the matte side are passed in front of anodes 32. An electric current is passed from the anodes 32 through the electrolyte 30 to the foil, which is rendered cathodic by the contact roller 28, to electrodeposit a copper dendritic layer on each of the matte side and the gilding layer deposited on the shiny side. The characteristics of the dendritic layers and the electroplating conditions useful in electrodeposition of the copper dendritic layers on the foil are well-known, and are disclosed in, for example, U.S. Pat. Nos. Re. 30,180, 4,572,768 and 3,857,681, all of which are incorporated herein by referenced.

After emerging from dendritic layer station 26, the foil is rinsed and passed to a second encapsulation layer station 34 where it passes over contact roller 36, is immersed in electrolyte 38, and is passed in front of anodes 40. An electric current is passed from anodes 40 through electrolyte 38 to the foil, and a second gilding layer is electrodeposited on each of the dendritic layers deposited on each of the matte and shiny sides of the foil. The characteristics of the second gilding layer and electrodeposition conditions useful in encapsulation station 34 are well-known, and are disclosed in U.S. Pat. Nos. Re. 30,180, 4,572,768 and 3,857,681, all of which are incorporated herein by reference.

The foil emerges from encapsulation layer station 34, is rinsed, and passed to barrier layer station 42, where it passes over contact roller 44, is immersed in electrolyte 46, and the matte side passes in front of anodes 48. An electric current is passed from anodes 46 through electrolyte 46 to electrodeposit a copper-zinc barrier layer on the treatment in the matte side of the foil which has been rendered cathodic by roller 44. Electroplating conditions useful in the barrier layer station are well-known and are disclosed in, for example, U.S. Pat. Nos. 4,572,768 and 5,207,889, both of which are incorporated herein by reference.

The foil having the barrier layer deposited on the matte side is then rinsed and passed to stainproofing station 50, where it passes over contact roller 52, is immersed in electrolyte 54 and each of the treated matte and shiny sides are passed in front of anodes 56. An electric current is passed from anodes 56 through electrolyte 54 to the foil, which is rendered cathodic by contact with roller 52 and a chromium-containing stainproofing is deposited on both sides of the treated foil. Electroplating conditions useful in stainproofing station 50 are well-known and are disclosed, for example, in U.S. Pat. Nos. 3,853,716, 3,625,844, and 5,447,619, all of which are incorporated herein by reference.

A major distinction between the prior art copper bonding treatment and the present micro-roughening deposit lies in the distribution of micro-spherical particles on the surface it is plated upon, the height and the spacing of these particles, in other words the scale of the micro-topography of the surface.

The scale of the present micro-roughened layer deposited on the shiny side is much finer than the scale of the prior art bonding treatment, its roughness is much lower and the distribution is much more uniform. These differences enable a surprising improvement in the wetting by and adhesion to photoresist materials when compared to prior art techniques applied to improve adhesion of a foil's shiny side to photoresist materials.

Bonding treatment relies on increased surface roughness to assure bondability. The present micro-roughening layer, on the other hand, is plated onto the shiny side of the foil to assure the good wetting of this surface by photo-resist, good spreading of photo-resist and very fine-scale enlargement of the surface roughness to assure good performance of brown-oxide treatment.

These objectives are best achieved by electrodeposition on the shiny side of the foil a plurality of layers, plated in a particular sequence (order), which together form a composite deposit characterized by desired surface micro-topography (of its outer surface).

We have found that deposition of only a bonding treatment (according to prior art), onto the shiny side of foil does not achieve these objectives.

Figure 5:
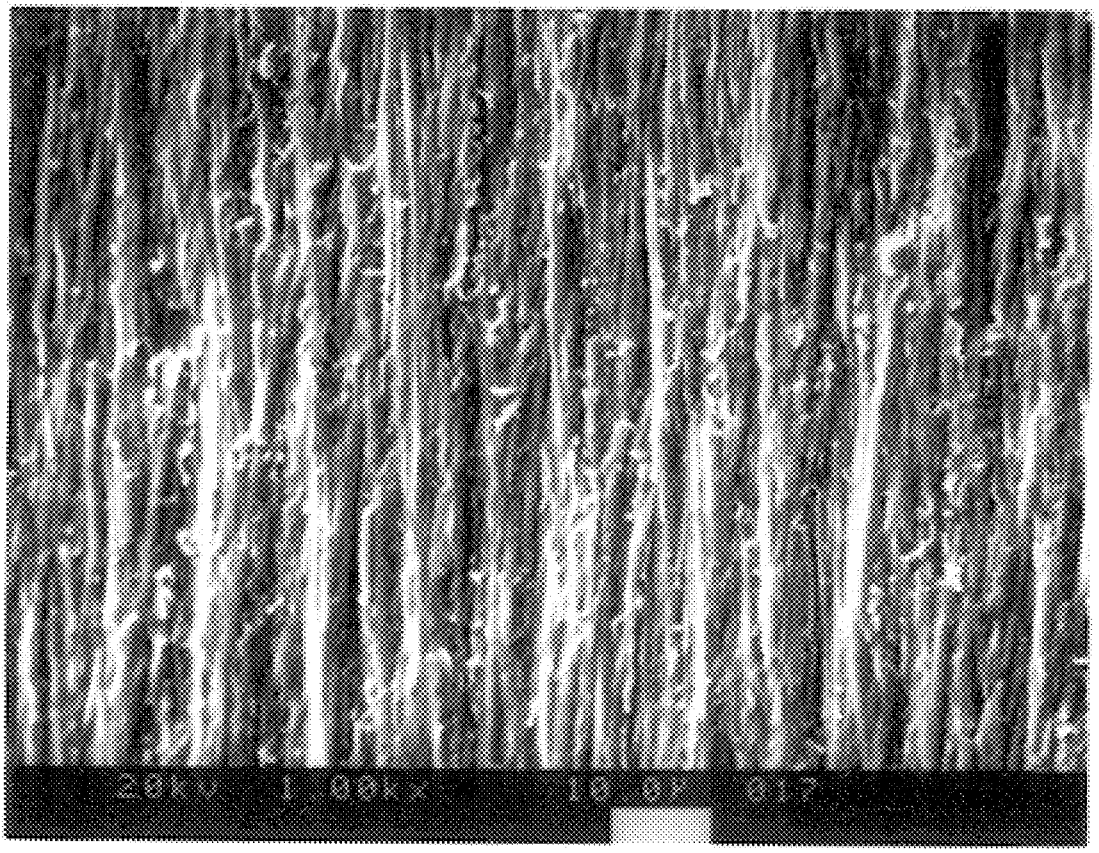
FIG. 5 illustrates the surface of the shiny side of a typical raw copper foil.

The shiny side of the foil is a mirror replica of the surface of the drum on which it is produced. As a result, its surface is not, actually, flat and smooth, but instead its micro-topography consists of surface irregularities, i.e., grooves and gouges mirroring those "inflicted" on the surface of the rotating drum-cathode used in the fabrication of the base foil, as shown in the photomicrograph of FIG. 5. This surface topography is the result of abrasion of the drum surface by the polishing brushes which foil manufacturers routinely use to keep drum surface clean, in preparation for the plating of the base (raw) copper foil.

When "normal" copper bonding treatment is plated onto the shiny side of the foil, it plates preferentially onto the ridges of the gouges and grooves, but not in the bottoms of the irregularities, therefore the surface roughness rapidly increases and the distribution of treatment is quite poor (not uniform).

This poor distribution of the treatment is caused by the fact that the deposition of a dendritic deposit (which is the first step of forming a bonding treatment, according to prior art), promotes, on purpose, very high concentration polarization. Under such conditions, electrodeposition accentuates roughness by putting more deposit on the prominences of the surface (ridges) than in the bottoms of the grooves because current density is highest on the projecting locations of the surface, since electric field strength is highest in that region (so-called negative micro-throw).

In sharp contrast, in the present invention the electrolyte used for encapsulating (gilding) step of the treatment, due to its high copper concentration, and high temperature, has a strong leveling effect (positive micro-trough), therefore copper deposit plated under such conditions fills the gouges and grooves of the surface of the shiny side of the foil and this renders this surface smooth. Once that is accomplished, the subsequent dendritic layer, followed by an encapsulation layer produce well distributed micro-particles that assure excellent, extremely fine-scale surface of this modified shiny side of the foil.

The precision of fine line circuitry depends on the adhesion of photo-resist to the shiny side of foil. That is the reason why manufacturers of PCB's subject the foil's shiny side to roughening by either mechanical or chemical means (pumice scrubbing, micro-etching, etc.) prior to applying a brown oxide treatment. In this respect, we have found that brown-oxide treatment applied to the present micro-roughened surface (greater surface area) is better compared to the same brown-oxide applied to non-modified shiny side.

The scale of micro-roughening is crucially important to maximizing the advantages of the present micro-roughening treatment to the field of extremely fine-line circuitry (e.g. track lines 2 mils wide, with 2 mils spacing).

The micro-roughening should be as fine and uniform as possible. By fine we mean actual dimension of surface irregularities. This "finess" is extremely important to both photo-resist wetting spread and adhesion, and also the help and enhancement it offers to a brown-oxide treatment's performance.

Copper foil with the present modified shiny side (MSS) possesses a micro-roughened shiny side surface and thus does not require micro-etching or the like to assure good photo-resist adhesion and good reaction with brown oxide. This micro-roughening is effected electro-chemically and produces a modified shiny side surface micro-topography composed of microscopic spherical copper balls that number about $4 \times 10^8$ per $inch^2$, wherein the size of micro-spheres is 1 up to 2 microns and they are spaced 0.2 microns up to 0.4 microns apart.

Moreover, the degree of micro-roughness can be controlled by the manufacturer of copper foil much better than mechanical or chemical roughening performed by manufacturer of printed circuit boards.

Thus, laminates produced by bonding the present MSS foil to the polymeric material MSS-side up, assures excellent photo-resist adhesion and thus a high degree of fine-line precision and definition.

In this context, the current methodology of providing the so-called shiny side of copper with a durable stainproof layer that requires vigorous removal is counter productive to establishing the ideal surface for photo imaging. This is because it relies on the circuit board manufacturer to handle the removal on individual boards during the course of his manufacturing process. In this case the stainproof removal techniques have to be established to deal with an anticipated "worst case" surface condition, whereas the present MSS foil can be manufactured under controlled operating conditions that can guarantee uniformity of surface topography in the course of manufacturing the copper foil before such foil is laminated. It is also the case, moreover, that the topography of MSS foil is particularly suitable for electro- or electroless-plating used in circuit board manufacture since it offers a significantly greater total surface area to receive such additional copper and thereby creates better integration between the superimposed layers.

The top surface of the modified shiny side of the foil should be provided with a type of stainproof that is capable of protecting the surface against tarnish and oxidation during storage and lamination, and is also easy to remove by simple chemical means. A preferred zinc-chromate stainproof is described in U.S. Pat. No. 5,447,619, which is incorporated herein by reference, although other stainproofing also may be used.

MSS Foil Production Examples

A one ounce copper foil was electrodeposited on a commercial rotating drum-cathode machine. The surface matte (drum) side of the foil had a peak height of approximately 8 microns and a peak to peak distance of approximately 10 microns, and the surface of the shiny side of the foil, when examined by electron scanning microscope, was found to have irregularities (grooves and gouges), as shown in FIG. 5.

Figure 2:
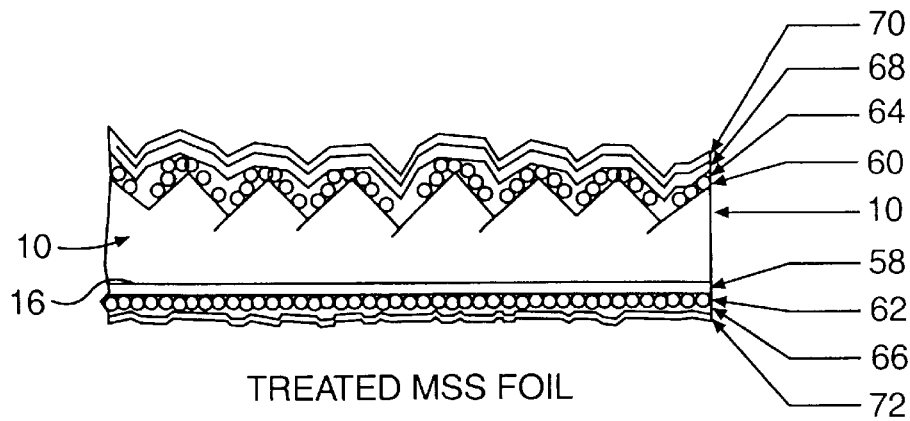
FIG. 2 illustrates a preferred embodiment of treated copper foil in accordance with the present invention.

Using apparatus of the type shown in FIG. 1, and as shown in FIG. 2, a copper gilding layer 58 was electrodeposited on the shiny side 16 of the foil 10 to modify the surface thereof and smooth the shiny side surface irregularities. First and second dendritic copper layers 60 and 62 were then electrodeposited, respectively, on each of the modified matte side and the shiny side of the foil, followed by electrodepositing copper gilding layers 64 and 66, respectively, on each of the dendritic copper layers. Subsequently, a zinc-containing barrier layer 68 was electrodeposited on the so-treated matte side of the foil, and chromium-containing stainproofing layers 70 and 72 were then electrodeposited, respectively, on the treated matte side and the treated modified shiny side of the foil. The conditions and electrolyte used in each of the above electrodeposition steps were as shown in parentheses in the following table, which also shows the preferred ranges of plating parameters.

|  |  | Encapsulating (Gilding) Layer | Dendritic (Powdery) Layer | Encapsulating (Gilding) Layer | Barrier Layer | Stainproof Layer |
|---|---|---|---|---|---|---|
| SHINY SIDE - | Plating time (sec) | 5 | 5 | 5 | 0 | 2 |
|  | Current (amp) | 2,200–2,700 (2,500) | 3,000–3,400 (3,200) | 2,300–2,700 (2,500) | 0 | 15–25 (20) |
|  | Anode length (inches) | 30 | 30 | 30 | 0 | 6 |
| MATTE SIDE - | Plating time (sec) | 0 | 7 | 7 | 3 | 0 |
|  | Current (amp) | 0 | 2,800–3,200 (3,000) | 2,300–2,700 (2,500) | 350–500 (400) | 0 |
|  | Anode length (inches) | 0 | 42 | 42 | 18 | 0 |

Note:
The most preferred condition is in parenthesis.
ELECTROLYTE
Dendritic (powdery) electrolyte - 18–22 (20) g/l Cu, 70–80 (75) g/l Sulfuric Acid (250–500) (400) ppm As, 3–6(4) ppm Cl, Temp - 75–85° F. (80° F.)
Encapsulating (gilding) electrolyte - 65–75 (70) g/l Cu, 65–75 (70) g/l Sulfuric Acid, Temp - 120–135° F. (130° F.)
Barrier Layer electrolyte - 20–28 (25) g/l Zn, 0–10 (5) g/l Ni, 1.2–1.8 (1.5) g/l Sb, pH - 1.8–2.2 (2), Temp - 120–135° F. (130° F.)
Stainproof electrolyte - 1.0–1.5 (1.25) g/l $CrO_3$, 0.5–0.8 (0.7) g/l Zn, 0.5–1.0 (0.7) g/l $H_3PO_4$, pH - 3.7–4.0 (4.0), Temp 77–82° F. (80° F.)
Note:
The most preferred condition is in parenthesis.

It was determined that deposition of the gilding layer 58 on the shiny side 16 of the above-described MSS foil leveled the surface of the shiny side by filling in the surface irregularities and provided a surface smoother than that of the shiny side of the raw foil, so that the subsequently-applied second dendritic layer, composed of small "balls" of copper, was substantially flat. Therefore, the surface of the third gilding layer was also substantially flat.

A comparison of the surface characteristics of the treated shiny side of the MSS foil versus those of prior art regular treated foil (RTF) is shown in FIG. 3.

Lamination and Circuit Formation

Figure 4:
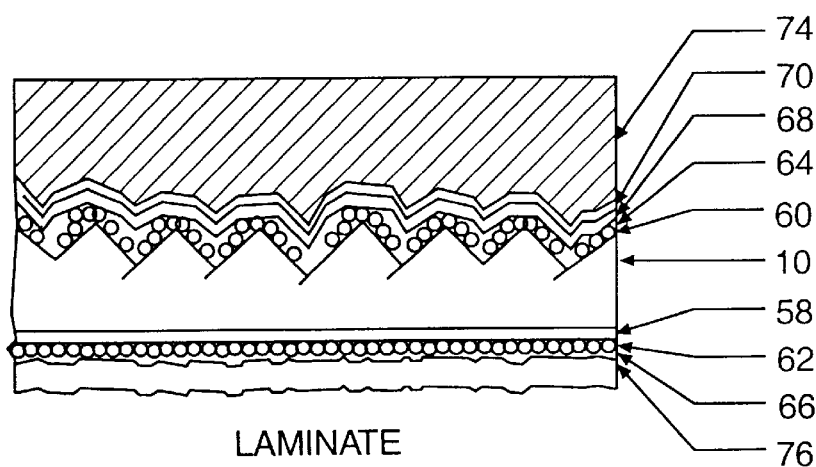
FIG. 4 illustrates a preferred embodiment of a laminate in accordance with the present invention.
Figure 6:
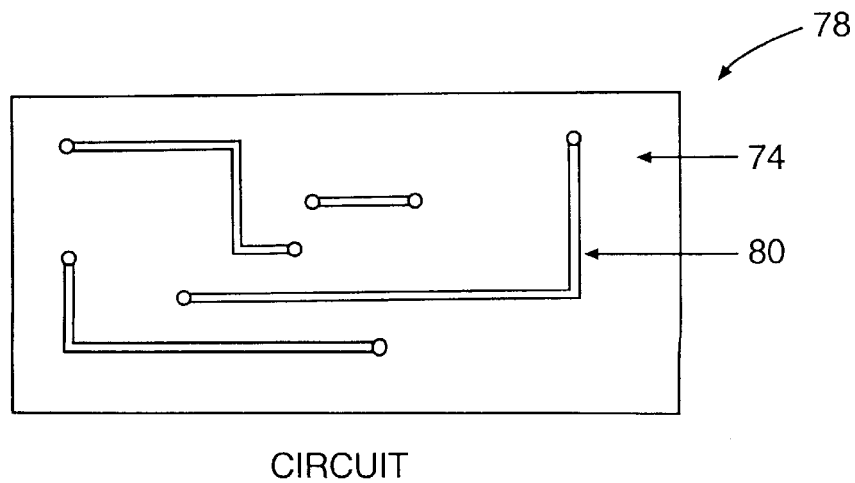
FIG. 6 illustrates an electrical circuit formed using a copper-clad laminate in accordance with the present invention.

MSS foil produced as described above was laminated to epoxy resin impregnated glass fiber (prepreg), with the treated matte side bonded to the substrate, using a conventional technique, as were standard treated copper foils, to form copper-clad laminates. As shown in FIG. 4, the treated matte side of the MSS foil, comprising first dendritic layer 60, first gilding layer 64, barrier layer 68 and stain proofing layer 70 was bonded to the polymeric substrate 74, and a photoresist layer 76 was applied to the surface of the treated shiny side of the MSS foil, followed by image patterning, etching and stripping to form 4 mil line and space, 3 line per-channel circuits. FIG. 6 illustrates a printed circuit board 78 wherein a circuit 80 has been formed on a substrate 74 by applying photoresist, imaging and etching MSS foil. The circuits were cleaned, subjected to a conventional brown oxide treatment and formed into MLB's. MLB's were also produced from the laminates made with standard treated foil using conventional techniques.

Various comparative tests were performed on MLB's produced with MSS foil and standard foil, and a comparison was made of processing techniques required for each.

As a result of such tests it was found that MLB's made with MSS foil had a typical prepreg to oxide foil bond strength of 8 lbs. compared to a typical bond strength of 6 lbs. for standard foil. This increase in bond strength was found to result in increased thermal reliability, which was demonstrated by T-260 testing, wherein MLB's made with MSS foil survived at 260° C. for an average of greater than 50 minutes, while MLB's produced with standard foil survived at the same temperature for an average of 10 minutes before delamination.

It was also found that in manufacturing PCB's there occurred an increase in overall innerlayer yields of 2–5% or more where MSS foil was used instead of standard foil. This is thought to be due to three primary attributes of MSS foil, namely:

1. The micro roughening of the shiny side provides improved resist adhesion
2. MSS has an inherently low profile when compared to standard copper and as such provides a cleaner etching time, resulting in reduced undercut and better line width control.
3. By virtue of its lower profile than standard foil, excess copper caused by unetched tooth structure in the laminate is also reduced.

Summarizing, we believe that the above comparative testing has demonstrated that the MSS foil of the present invention is a superior alternative to standard copper foils when used in the manufacture of PCB's, because the MSS foil provides:

1. Simplification of copper cleaning and the elimination of the need for subtractive processes such as micro etching prior to innerlayer imaging.
2. Increased innerlayer yields due to improved resist adhesion and cleaner etching.
3. Simplification of the oxide process by elimination of the need for micro etching step.
4. Improved PCB reliability due to increased prepreg-to oxide bond.

Having described preferred embodiments of the present invention, it will be appreciated that variations and modifications thereof falling within the spirit of the invention may become apparent to those skilled in the art, and the scope of the invention is to be determined by the appended claims and their equivalents.

What is claimed is:

1. Copper foil comprising electrolytic copper foil having a matte side and an opposite shiny side, a first electrodeposited copper gilding layer on the surface of the shiny side and an electrodeposited copper micro-roughening layer on the copper gilding layer.

2. The copper foil of claim 1, wherein the surface of the shiny side has micro-irregularities thereon, and the surface of the copper gilding layer is smoother than the surface of the shiny side.

3. The copper foil of claim 1, further including a copper bonding treatment electrodeposited on the matte side.

4. The copper foil of claim 1, wherein the micro-roughening layer comprises a dendritic copper layer electrodeposited on the gilding layer and a second copper gilding layer electrodeposited on the dendritic layer.

5. The copper foil of claim 4, further comprising a stainproof layer electrodeposited on the second gilding layer.

6. Copper foil comprising:

(a) an electrolytic copper base foil having a matte side and an opposite shiny side;
    (b) a first copper bonding treatment on the matte side formed of (i) a first electrodeposited dendritic copper layer on the surface of the matte side, and (ii) a first electrodeposited copper gilding layer on the dendritic layer, forming a treated matte side; and
    (c) a micro-roughening layer on the shiny side formed of (i) a second electrodeposited copper gilding layer on the surface of the shiny side, (ii) a second electrodeposited dendritic copper layer on the second gilding layer, and (iii) a third electrodeposited gilding layer on the second dendritic layer, forming a modified shiny side.

7. A copper-clad laminate comprising:

(a) a polymeric substrate; and
    (b) the copper foil of claim 6;
    wherein the treated matte side is bonded to the substrate.

8. An electrical circuit comprising the laminate of claim 7 which has been formed by applying a photoresist material on the modified shiny side and forming an image pattern of the circuit by removing a portion of the photoresist material, and etching an exposed portion of the modified shiny side from direction of the modified shiny side to form the circuit.

9. The circuit of claim 8, wherein the modified shiny side has been subjected to a brown oxide treatment.

10. A process for treating an electrolytic copper base foil having a matte side and an opposing shiny side, which process comprises the steps of:

(a) eletrodepositing a first dendritic copper layer on the matte side;
    (b) electrodepositing a first gilding layer of copper on the first dendritic layer;
    (c) eletrodepositing a second gilding layer of copper on the shiny side;
    (d) eletrodepositing a second dendritic copper layer on the second gilding layer; and
    (e) eletrodepositing a third gilding layer of copper on the second dendritic layer;
    thereby forming a treated copper foil having a treated matte side and a treated shiny side.

11. A process for forming a copper clad laminate formed of a treated copper foil produced by the process of claim 9 and a polymeric substrate, which process comprises bonding the treated matte side is to the substrate.

12. A process for forming an electrical circuit on a laminate produced by the process of claim 11, which comprises the steps of applying a photoresist material on the modified shiny side, exposing a portion of the resulting surface of the modified shiny side, and etching the resulting exposed portion to form the circuit.

13. The process of claim 12, further comprising subjecting the exposed surface of the circuit to a brown oxide treatment.

14. The copper foil of claim 6, further comprising an electrodeposited barrier layer on the treated matte side.

* * * * *